US008143431B2

(12) United States Patent
Norman et al.

(10) Patent No.: US 8,143,431 B2
(45) Date of Patent: Mar. 27, 2012

(54) LOW TEMPERATURE THERMAL CONDUCTIVE INKS

(75) Inventors: John Anthony Thomas Norman, Encinitas, CA (US); Melanie K. Perez, Escondido, CA (US); Robert Krantz Pinschmidt, Jr., Carrboro, NC (US)

(73) Assignee: Air Products and Chemicals, Inc., Allentown, PA (US)

( * ) Notice: Subject to any disclaimer, the term of this patent is extended or adjusted under 35 U.S.C. 154(b) by 978 days.

(21) Appl. No.: 12/126,333

(22) Filed: May 23, 2008

(65) Prior Publication Data

US 2008/0305268 A1    Dec. 11, 2008

Related U.S. Application Data

(60) Provisional application No. 60/942,007, filed on Jun. 5, 2007.

(51) Int. Cl.
C07F 1/08 (2006.01)
C23C 16/00 (2006.01)
(52) U.S. Cl. ...................................... 556/113; 106/1.18
(58) Field of Classification Search .................. 556/113; 106/1.18
See application file for complete search history.

(56) References Cited

U.S. PATENT DOCUMENTS

| 4,847,239 | A | 7/1989 | Piotrowski et al. |
| 6,036,889 | A | 3/2000 | Kydd |
| 6,818,783 | B2 | 11/2004 | Norman et al. |
| 6,824,603 | B1 | 11/2004 | Kydd |
| 6,951,666 | B2 | 10/2005 | Kodas et al. |
| 2003/0180451 | A1 | 9/2003 | Kodas et al. |

FOREIGN PATENT DOCUMENTS

WO    WO03032084 A2    4/2003

OTHER PUBLICATIONS

Whitesides, G.M., et al; "Copper(I) Alkoxides. Synthesis, Reactions, and Thermal Decomposition"; 1974; vol. 96 (9); pp. 2829-2835.
P.M. Jeffries and G.S. Girolami, Chemical Vapor Deposition of Copper and Copper Oxide Thin films from Copper (I) tert-Butoxide, Chemistry of Materials, Aug. 17, 1988, p. 8-10, vol. I, No. 1, US.
Hakansson, M., et al; "Copper(I) Alkoxides: Preparation and Structural Characterisation of Triphenylmethoxocopper(I) and of an Octanuclear Form of T-Butoxocopper(I)"; Inorganica Chimica Acta 304; 2000; pp. 178-183.

*Primary Examiner* — Porfirio Nazario Gonzalez
(74) *Attorney, Agent, or Firm* — Lina Yang

(57) ABSTRACT

Novel copper alkoxide compound based ink formulations and their chemical syntheses are disclosed. The method of using the ink formulations to print conducting copper metal lines with standard ink jet printing and curing at <150° C. is also disclosed.

23 Claims, 12 Drawing Sheets

LOW TEMPERATURE THERMAL CONDUCTIVE INKS

CROSS-REFERENCE TO RELATED APPLICATIONS

This application claims the benefit of priority under 35 U.S.C. §119(e) to earlier filed U.S. patent application Ser. No. 60/942,007, filed on 5 Jun. 2007.

BACKGROUND OF THE INVENTION

The emerging field of printed electronics promises to create a wide range of consumable electronic devices, many of which will be manufactured at very high volumes and very low cost. It is the ability to directly print these devices using known printing techniques that promises to keep their cost of production low by minimizing energy, materials consumption and environmental impact. For instance, while semiconductor transistor devices have historically been manufactured on silicon wafers under high vacuum conditions in expensive cleanroom type environments, transistor devices can now be directly printed onto inexpensive substrates using common bench top printing devices, such as ink jet printers. Additionally, the use of a printing press permits the 'direct write' of materials, such that a multilayered device can be constructed without wasting materials, which keeps costs down and lowers the environmental burden associated with disposing of waste materials.

By contrast, silicon wafer type electronic devices are built up in a multilayered process, whereby layers, such as dielectrics, are blanket deposited over the entire wafer, photolithograpically patterned and then etched leaving the desired pattern intact. Similarly, metal layers of copper are deposited on the wafers, and then, excess copper is removed in a chemical mechanical polishing step.

Both of these processes are thus 'subtractive' in that a material layer is first applied and then portions of it removed to leave behind the desired pattern or shape. Thus, excess material that is consumed in the first step becomes waste in the second step. This is especially problematic for metals such as copper since it constitutes a toxic waste.

Besides providing an alternative low cost manufacturing pathway for electronic devices, there are also new emerging technologies that promise to be enabled by the innovation of printed electronics. An example of this is the rapidly expanding field of Radio Frequency Identification (RFID) tags. This revolutionary technology comprises of a microchip connected to a metallic antenna, which when subjected to a specific radio frequency from a 'reader' unit, activates the chip to broadcast its identity profile back through the antenna to the reader. In this way inventory, for instance, can be instantaneously read by driving by with a reader unit, or items can be automatically registered at a checkout counter. At higher levels of functionality, these devices can be integrated into wireless networks to form the backbone of a 'smart environment' where, for instance, the temperature, lighting and entertainment of a home can be seamlessly adjusted by sensing the homeowners presence and movement by RFID. In all cases, a key requirement is that the RFID tag has a highly conducting metallic antenna and, due to the severe pricing pressure associated with the tags, it is widely accepted that this feature will need to be directly printed using metallic inks, preferably copper. Other applications where the direct printing of metals, such as copper, would be particularly beneficial include the direct write of circuit boards for the mounting and interconnection of electronic systems. These boards comprise a grid of conducting copper lines mounted on an insulating substrate. The current process for manufacturing them essentially begins with a sheet of copper which is patterned with the desired copper grid layout, and then the copper sheet is etched to leave only the pattern remaining. Thus, >90% of the copper is eliminated as a waste, which must be disposed of.

Other examples of electrical devices, which need to be fabricated using printing techniques are display screens, which can be flexible. Typically, these screens need an electrically conducting matrix to be printed on one surface to address and illuminate individual pixels, which provide an image, or they need conductive pathways printed to power light emitting display sources, such as organic light emitting diodes ("OLEDs").

There are many commercially available metal inks for the above and other applications, including silver inks and copper inks, in addition to those for other metals, such as nickel. In general, it is highly advantageous to create metal inks, which can be processed at low temperatures, since this permits their printing and curing to be performed on thermally sensitive substrates, such as polymers and papers, which are prized for their ready availability, flexibility and low cost. In general, inks which can be cured below 150° C. are the most desirable.

There are many printing techniques amenable to the manufacture of printed electronics including, but not limited to, gravure, silk screen, litho and ink jet. However, the most rapidly evolving technique amongst these is ink jet, due to its ability to be programmed to print a wide variety of different patterns and overlays compared to the other techniques, which rely on the printing from an essentially fixed pattern embossed or etched in some way in the form of a master die, which is repetitively used. In addition, there are constant improvements in ink jet technology, which are driving the ink drop sizes smaller, their placement on the substrate more accurate and increasing the number of printing nozzles on a print head, currently available at approximately 4000 nozzles per head, to provide high density printing for high throughput, including reel-to reel capability.

Silver, being the most conductive metal with a resistivity of 1.6 microohmcm, currently enjoys the most widespread use as an ink, which can be printed to give conducting films of metal. There exists a wide range of silver inks of varying viscosities and chemical formulation, which can be selected from depending upon the exact application and printing technique to be used. For instance, if silk screen printing is used, then a relatively high viscosity ink >1000 Cps can be utilized.

By comparison, a low viscosity silver ink <100 Cps, such as used by Cabot, would be selected if ink jet printing was to be used. Typically, these silver inks are comprised mostly of silver metal particles ranging from multi-micron or sub-micron particles, that are approximately spherical or flake-like in shape to 'nano-powder' inks of <200 nm diameter metal particles. Metal powder loading of these inks can range from 20-80 wt % and are typically mixed with a liquid medium, which is selected to be an agent to enhance the printability of the ink and/or to participate chemically in the thermal rendering of the ink into a conducting silver line. For instance, the chemical agent added to the silver particles may participate in the sintering of the silver particles together into an electrically connecting and conducting mass. Additionally, if a silver containing compound is present in the silver ink (either as a deliberately added specie or specie formed in situ), which can thermally break down to form fresh silver metal, then this fresh metal will aid in the fusion of silver particles to each other to form a conductive matrix. Many silver inks can be thermally cured below 250° C., some below 200° C., and some below 150° C. The lower temperature inks are the most desired for many printing applications. Since silver is a relatively noble metal, whose oxide is electrically conductive, silver inks can be printed and thermally cured in air, without deleteriously affecting their electrical performance. Silver's electrically conducting oxide also means, that when particles of silver are in intimate contact, they will establish electrical interconnectivity, even if they are coated with it. However, not withstanding the high electrical conductivity and relative ease with which conductive inks can be made from silver, it remains a relatively expensive metal, prohibitively so, for very high volume and low cost printed electronics devices. Copper, with a resistivity of 1.67 microohmcm, is almost as conductive as silver, but has a greater capacity to handle high current loads due to its superior electromigration resistance. Additionally, copper is more abundant and less expensive than silver, which makes it a very attractive candidate for conducting inks. There are however, challenges associated with creating copper inks, which can yield conducting lines of metal at temperatures <150° C.

Unlike silver, the oxide coatings on copper particles are found to be insulating rather than conducting. Therefore, if an ink comprising mostly copper metal powder is prepared, a chemical technique must be established whereby the oxide can be effectively removed during the thermal cure step to permit the particles to come into intimate contact and thereby establish an electrically conducting matrix. Additionally, a specie or species may be either introduced, or created in situ, which thermally breaks down to yield fresh copper metal, which also aids in fusing the copper particles together. Therefore, if a copper metal powder is brought into contact with an acidic species capable of removing the oxide, as the mixture is heated to a cure temperature the resultant copper compound, which forms from the oxide, breaks down to give fresh copper metal. Copper metal particle sintering is then expected to occur. In other words, the copper particles are cleaned of oxide, and then, effectively welded together. This represents the technology of Kydd (U.S. Pat. No. 6,036,889), where copper powder is mixed with neodecanoic acid, which upon heating this mixture to >250° C. results in a conducive copper trace. However, curing below this temperature results in the above mechanism not being fully operative, resulting in an incompletely sintered and poorly conducting metal film of poor mechanical properties. Therefore, these inks can not be used to print and cure copper lines onto thermally sensitive substrates, where a cure below 150° C. is desired. In a similar approach, Kydd also describes (U.S. Pat. No. 6,824,603) using mixed metal oxide powders with acid type components which react together to give a metal compound, which in turn breaks down to give metal during a thermal cure. However, this too is distinct and different from the present invention.

Also unlike silver, copper inks can not be effectively thermally processed in air, since the resultant copper film will undergo oxidation to copper oxides, which will raise the resistivity of the resulting copper film. Therefore, it is desirable to thermally cure copper inks in an inert atmosphere. For copper inks, silver inks and other metal inks, having the inks comprised mostly of metal powder represents an approach by which to maximize the metal 'loading' of an ink. However, for some applications, such as ink jet printing, where the ink needs to be ejected through a very small diameter orifice, typically <100 microns, metal powders can lead to problems with clogging the jets and settling out by sedimentation upon standing.

BRIEF SUMMARY OF THE INVENTION

In one respect, the present invention provides a precursor containing at least one copper alkoxide having a formula Cu—O—R;

wherein —O—R is selected from the group consisting of a radical of a secondary alcohol having an alkyl group of $C_4$ to $C_{12}$; a primary alcohol giving $CuOCH_2CH(Me)R'$; and mixtures thereof;

wherein R' is selected from the group consisting of an alkyl having 1 to 8 carbons, an alkenyl having 2 to 8 carbons, an alkynyl having 2 to 8 carbons, and combinations thereof.

In another respect, the present invention provides a process for synthesizing a precursor containing at least one copper alkoxide comprising reacting an alcohol with a copper compound selected from a group consisting of a bi-nuclear copper organometallic compound; copper mesitylene; copper tertiary alkoxide made from tertiary alcohol; and mixtures thereof.

In yet another respect, the present invention provides a method for copper ink printing comprising
  providing a precursor having at least one copper alkoxide with formula Cu—O—R;
  wherein —O—R is selected from the group consisting of a radical of a secondary alcohol having an alkyl group of $C_4$ to $C_{12}$; a primary alcohol giving $CuOCH_2CH(Me)R'$; and mixtures thereof; wherein R' is selected from the group consisting of an alkyl having 1 to 8 carbons, an alkenyl having 2 to 8 carbons, an alkynyl having 2 to 8 carbons, and combinations thereof;
  applying the precursor to a substrate;
  heating the precursor on the substrate to decompose the precursor to copper metal and volatile by-products;
  removing the volatile by-products.

DETAILED DESCRIPTION OF THE INVENTION

Novel liquid copper compound based ink formulations and their chemical syntheses are disclosed, which can be used to print conducting copper metal lines using standard ink jet printing and curing at <150° C., without necessarily needing the addition of copper powders to increase the copper metal loading or other materials to lower the processing temperature of the ink. Thermal decomposition to copper metal and volatile by-products is rapid. The resulting copper lines can also be used as a conducting copper seed layer for subsequent copper electroplating to build up the thickness of copper metal. In embodiments of the present invention where there is no copper powder added, all of the copper metal particles produced during thermal cure are fresh 'nascent' metal, which when formed in the absence of oxygen and moisture is oxide free, and therefore, highly effective at bonding to itself to give a mechanically robust and conducting metal matrix.

Additionally, this fresh copper metal adheres strongly to flexible polymer substrates, such as polyester, providing excellent adhesion. Whilst not wishing to be bound by theory, it is believed the copper is able to strongly bind to such surfaces and to itself due to its nascent and reactive character. Also, some of the copper inks described herein are sufficiently concentrated (>6.0M) in copper that their effective % wt copper metal matches or exceeds that of commercially available silver ink jet inks, that are based on silver metal nanopowder. This high loading of metal content allows conductive copper lines to be printed in one pass of the ink jet printer, thereby providing the direct write of copper metal. If inks are desired where the copper loading needs to be higher, then surface oxide free copper powders can be added, or formed in situ by partial thermal degradation of the copper compound based ink. In some cases, a deliberately thin copper film is printed and cured to form a conducing 'seed layer' of copper, which can then be electroplated to give a thicker copper film.

The synthesis, characterization and use of copper alkoxide formulations for the printing, preferably ink jet printing, of copper are described. The formulations can also be used in spin-on applications where the ink is dispensed onto a spinning substrate and covers the surface by centrifugal force. The formulations can be sprayed on a surface by shower-head type dispensers to provide blanket layers, possibly as seed layers for addition copper metal deposition.

Figure 1:
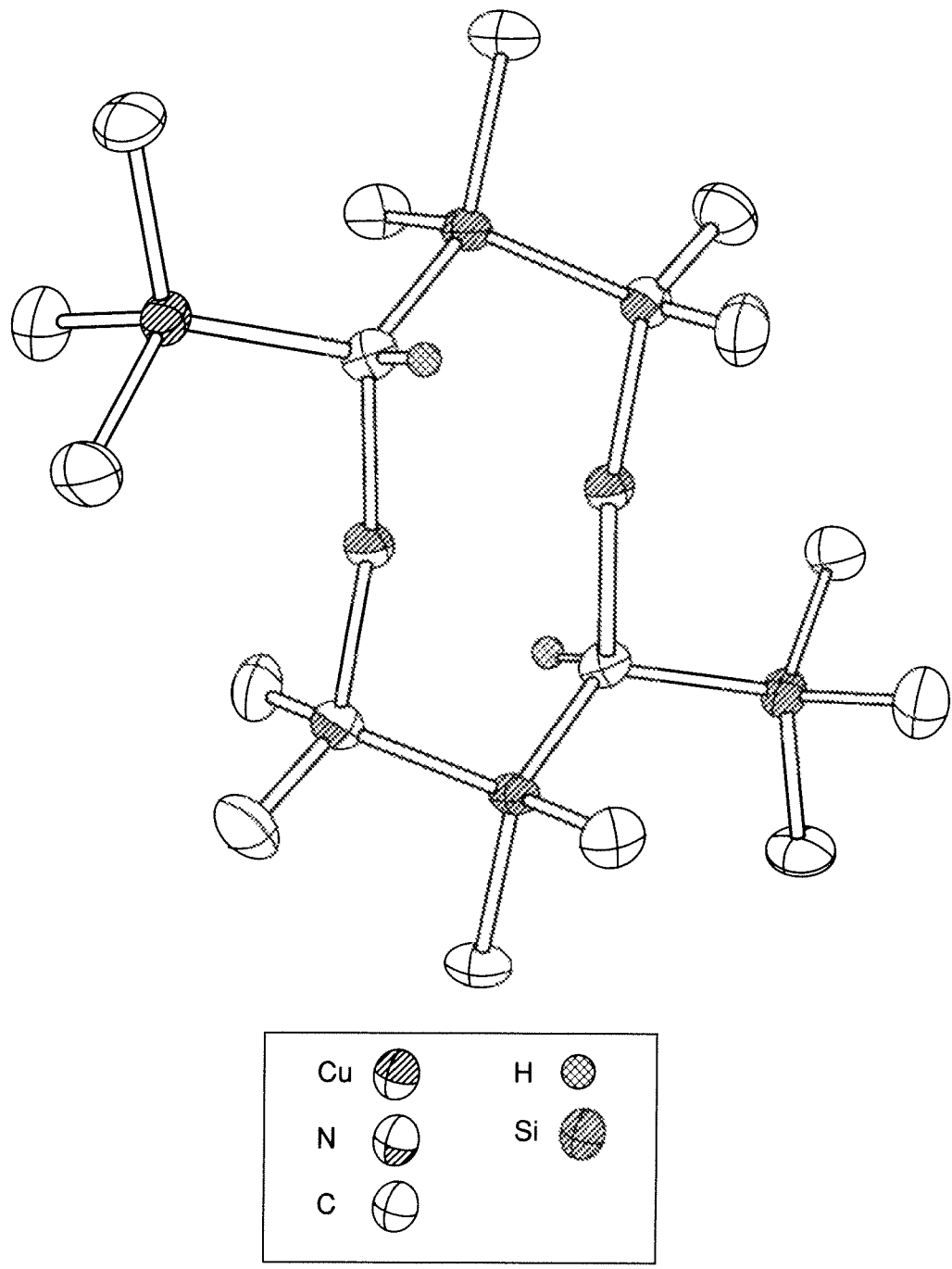
FIG. 1 is a molecular modeling depiction of a bi-metallic copper organometallic precursor to a molecule of a copper alkoxide.

In one exemplary embodiment, the synthesis of copper alkoxide formulations is achieved by the novel reaction between a bi-nuclear copper organometallic compound and an alcohol, which has previously been dried and deoxygenated. The bi-nuclear copper organometallic complex (named G2) used in this synthesis is shown in FIG. 1, wherein the carbon atoms are of methyl groups or bonded to copper. Copper compounds of the type G2 are described in U.S. Pat. No. 6,818,783 incorporated by reference herein in its entirety.

Being a stable volatile copper (+1) bi-nuclear complex, it is readily prepared and purified in high yield by sublimation. We found it to be an excellent reagent to cleanly react with dry deoxygenated alcohols (ROH) to give pure copper (+1) alkoxide and a volatile byproduct (G2OR), which is readily removed by vacuum distillation. Alternatively, the G2OR is not removed by vacuum distillation and the mixture of G2OR/CuOR is used directly as a copper ink. This chemical reaction is shown below in Scheme 1, where the copper(+1) alkoxide is shown as CuOR.

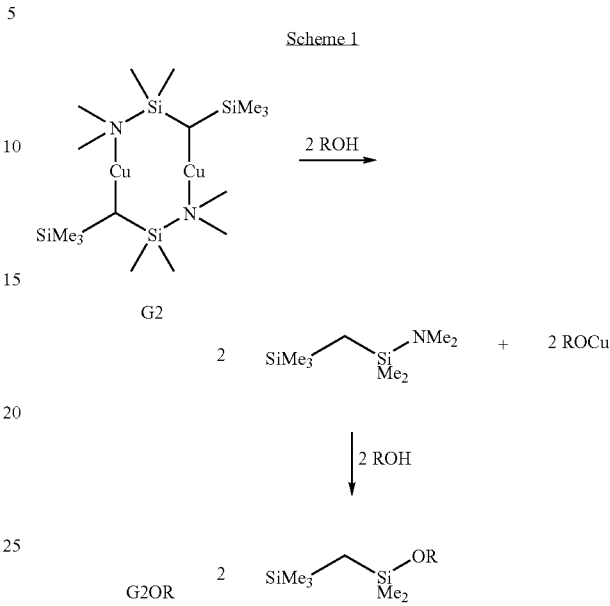

An example of G2 is [—CuNMe$_2$SiMe$_2$CHSiMe$_3$CuNMe$_2$SiMe$_2$CHSiMe$_3$—].

The copper alkoxide thus formed, when ROH was 4-methyl-2-pentanol, was isolated as a golden yellow oil which, when subjected to heating under nitrogen in a Thermogravimetric Analysis (TGA) apparatus, was shown to cleanly decompose to copper metal and volatile organic by-products.

In the TGA technique, a sample of copper alkoxide is heated in a microbalance at an increasing temperature ramp rate under a steady flow of pure nitrogen gas. Thus, weight loss can be monitored as a function of temperature. A representative TGA trace was shown in FIG. 2 for the copper ink made by reacting G2 with the alcohol 4-methyl-2-propanol to give the golden yellow liquid complex copper(+1) 4-methyl-2-propoxide (that is Cu4MPA). The loss of weight was shown by the dotted line, and the Differential Scanning Calorimetry (DSC) result was shown by the solid line. The latter detects exothermic and endothermic events as they occur as a function of temperature.

Clearly, there is a sharp exotherm at ~115° C. (metallization), followed by a sharp endotherm due to the evaporation of volatile by-products, and the residual mass remaining corresponds to the theoretical yield of copper metal. The metallization exotherm at 115° C. showed that these inks are excellent candidates for printing copper onto thermally sensitive substrates, such as polyester or paper. The sharpness of the exotherm indicated in the TGA points to the ability of these inks to be printed at just below their metallization temperature, and then, needing only a modest temperature increase to effect metallization.

This represented a desirable characteristic, since a broad exotherm would indicate the need to ramp the temperature of the printed sample through a wider range, which consumes more time, thus slowing down the printing process. It also pointed to the inks being relatively stable at room temperature, which is important for shelf life. The characteristic sharp exotherm profile shown in FIG. 2 was also seen for the copper alkoxides made from the secondary alcohols 2-pentanol, 2-hexanol, 2-octanol, 2-nonanol, 3-methyl-2-pentanol, 4,4-dimethyl-2-pentanol and 5-methyl-2-hexanol.

For the Cu4MPA ink, the total weight loss corresponded to the elimination of the by-products 4-methyl-2-pentanol and methylisobutyl ketone from the 4-methyl-2-pentoxide portion of the molecule. This is the primary mechanism by which these inks function, that is, a redox reaction occurred to yield copper metal and the corresponding ketone and parent alcohol. To identify these redox by-products of metallization from thermolysis of the Cu4MPA oil, a sample of the latter was heated under vacuum at 120° C., the volatile species were trapped and driven off in a liquid nitrogen cooled trap, and then, and they were analyzed using gas chromatograph-mass spectrometry ("GCMS") and gas chromatograph ("GC"). This conclusively identified the by-products to be an essentially equal mixture of methylisobutyl ketone and 4-methyl-2-pentanol, which were readily rationalized as the redox products of two molecules of Cu4MPA, as shown below in Scheme 2. Thus, a very clean system, yielding by-products that were both innocuous and volatile was represented.

Scheme 2

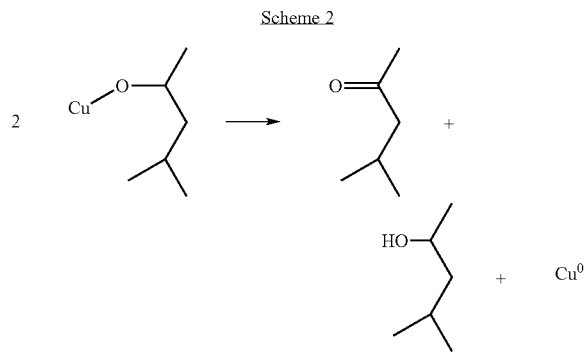

To characterize the Cu4MPA, a solution of Cu4MPA was treated in tetrahydrofuran ("THF") solvent with deoxygenated water to give a thick orange precipitate of cuprous oxide/hydroxide. The THF layer was analyzed by GCMS to show 4-methyl-2-propanol as the sole organic product present, that is, the product of water protonation of the alkoxide anion. In addition, Cu4MPA was treated with trimethylchlorosilane to give a white precipitate of cuprous chloride and a colorless liquid, which was identified by GCMS as 4-methyl-2-trimethylsilyloxypentane, $MeCH(OSiMe_3)CH_2CH(Me)_2$, that is, the trimethylsilylation product of 4-methyl-2-pentoxide anion, thereby confirming the latter as the sole organic component present in the copper complex.

Figure 2:
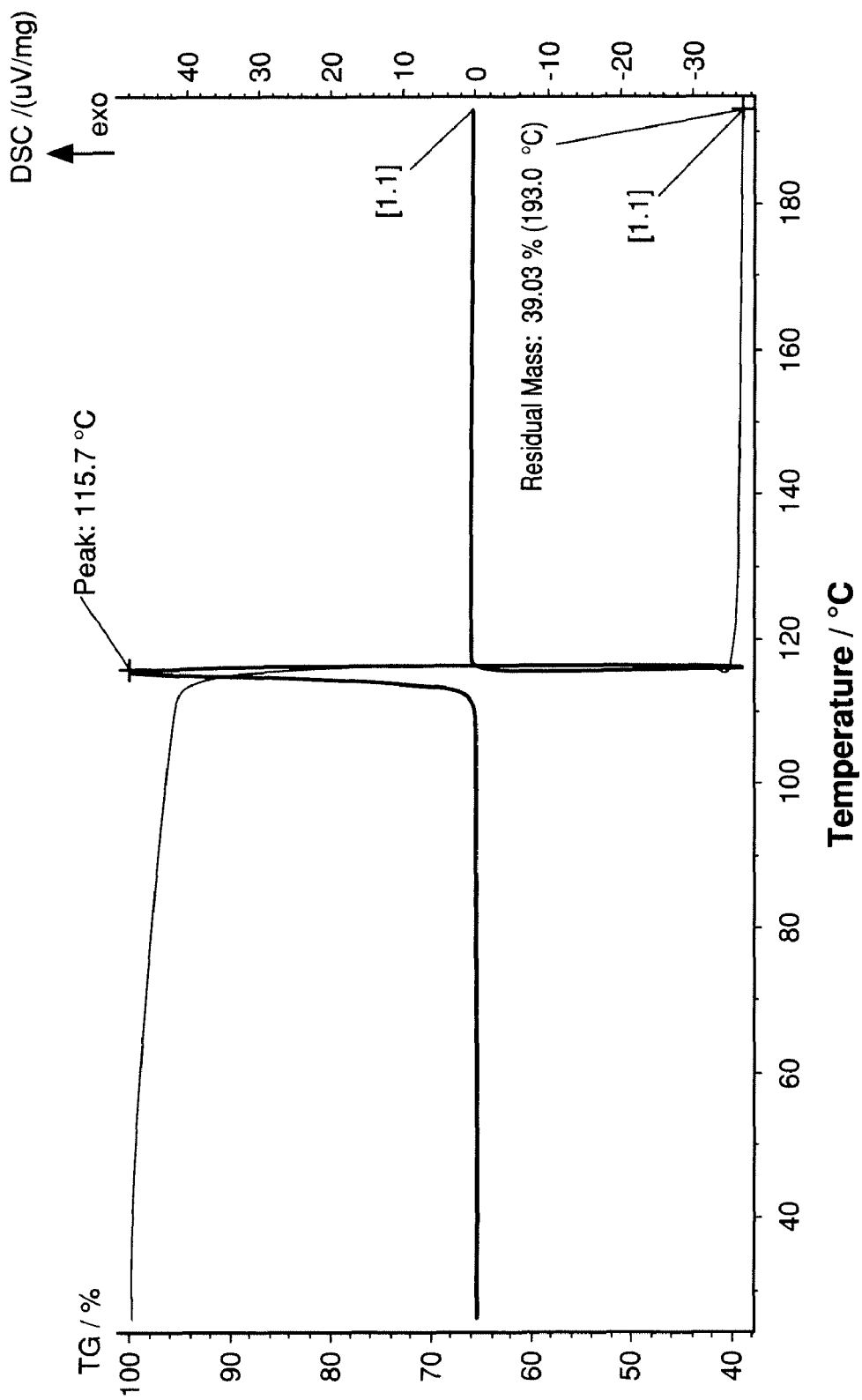
FIG. 2 is a Thermogravimetric Analysis/Differential Scanning Calorimetry ("TGA/DSC") trace of the decomposition of copper-4-methyl-2-pentanoxide(Cu4MPA).

An additional benefit in printing and curing these copper alkoxide inks can accrue by selecting a copper alkoxide, whose parent alcohol and ketone (the metallization by-product) possesses sufficiently high boiling points, that the endotherm of evaporation of by-products is broader and occurs at a higher temperature than the metallization exotherm. Thus, the close proximity of the exotherm and endotherm seen in FIG. 2 is avoided. This permits the exothermic metallization step to occur in the absence of an overlapping or simultaneous endotherm of evaporation. Additionally, it occurs in a liquid phase comprised of uncured ink plus metallization by-products.

This step is then followed by a relatively slow by-product evaporation, thereby permitting the copper metal particles formed a better chance of sintering into a denser metal film. In contrast, the almost simultaneous exotherm/endotherm shown in FIG. 2 can lead to rapid outgassing of by-products, which in turn can tend to physically expand the curing copper film into a porous morphology.

Figure 3:
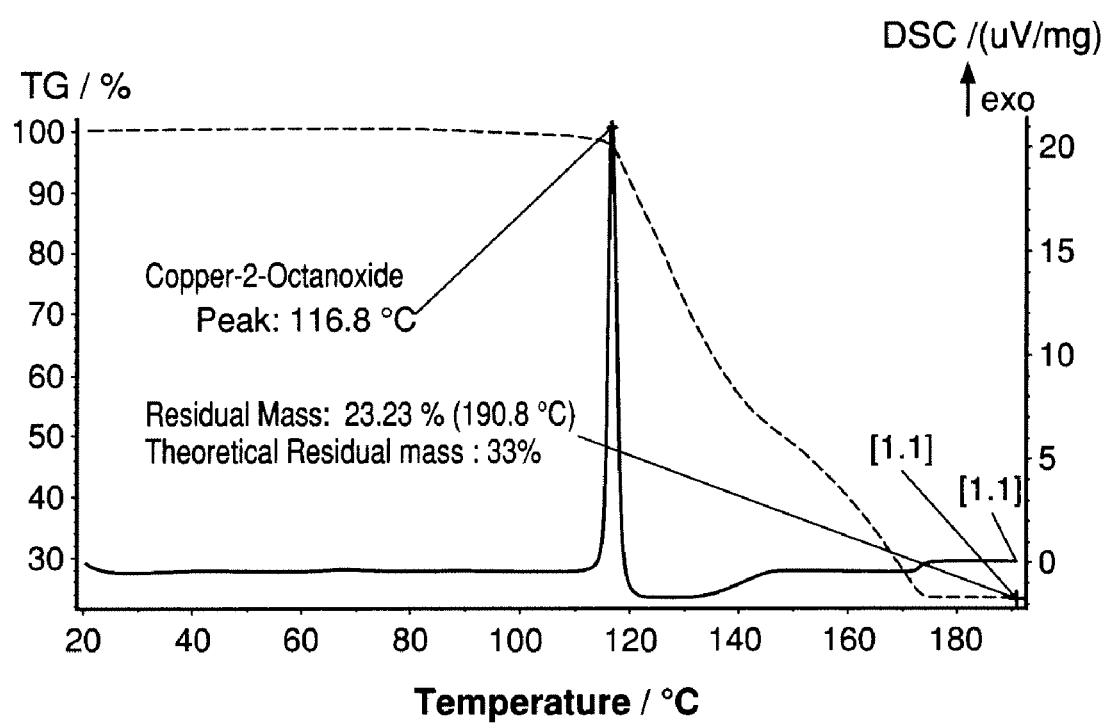
FIG. 3 is a TGA/DSC of the decomposition of copper-2-octanoxide (Cu2OCTA).

An example of an ink, where the exotherm of metallization and endotherm of by-product evaporation are separated, is shown below in FIG. 3, which is the TGA/DSC trace for the copper alkoxide derived from the reaction of G2 with 2-octanol. The exotherm of metallization at 120° C. is followed by a gradual and broad endotherm of by-product evaporation, shown by the dotted line.

A similar effect may also be achieved by dissolving a copper alkoxide ink in a solvent, whose boiling point is substantially higher than the metallization temperature, but still volatile enough to allow complete evaporation below 200° C. in a reasonable period of time. However, when using this approach with an ink possessing the thermochemical characteristics shown in FIG. 2, the by-products will still boil out at the same temperature, thereby potentially still tending to 'inflate' the cured cooper film into a porous state.

Figure 4:
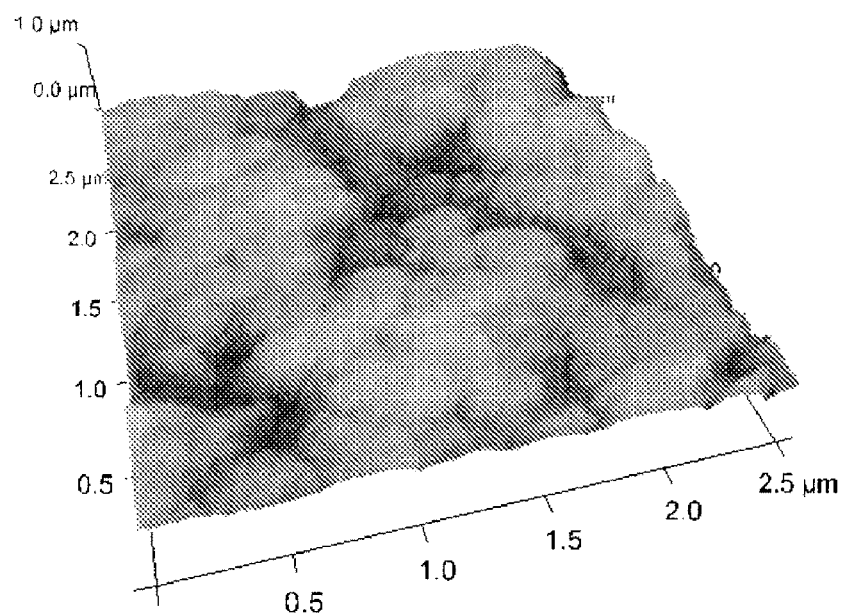
FIG. 4 is an Atomic Force Microscopy (AFM) of the surface roughness of a copper film grown from copper-2-hexanoxide (Cu2HXA) grown on a glass slide.
Figure 5:
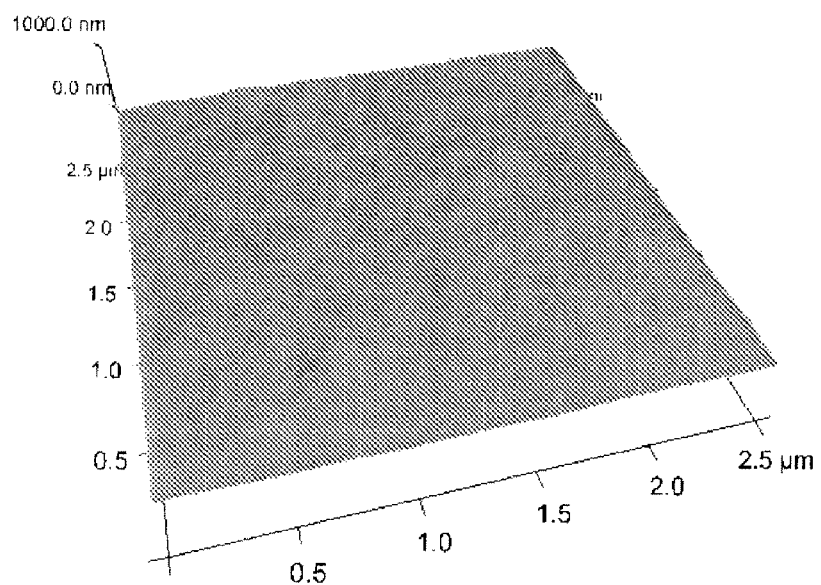
FIG. 5 is an Atomic Force Microscopy (AFM) of the surface roughness of a copper film grown from Cu-2-nonanoxide (Cu2NONA) grown on a glass slide.

FIGS. 4 and 5 showed the surface roughness, as determined by Atomic Force Microscopy (AFM), of copper films grown from Cu2HXA and Cu2NONA, respectively, onto glass slides. These films were prepared applying 1 drop samples of 35 and 37 wt % of Cu2HXA and Cu2NONA respectively in hexane individually to glass slides then heating to 142° C. under nitrogen. Clearly the Cu2NONA film is much smoother than the CU2HXA film, consistent with the by-products from the latter boiling off after metallization has occurred.

Table 1 shows the metallization temperatures for a series of copper alkoxides derived from secondary alcohols and the boiling points of the metallization by-product alcohols and ketones. The metallization temperature, cure temperature, or thermal curing temperature are used exchangeablly in this application.

It is seen that the metallization temperatures range from 114.7 to 133° C., but predominantly 115-119° C. The boiling points of the by-product alcohols and ketones range from 101-150° C., but predominantly are in the range of 118-140° C., with the exception of 2-nonanol/2-nonanone and 2-octanol/2-octanone, which boil ~50-80° C. higher than the average metallization temperatures of ~120° C. This larger difference allows the formation of a denser copper film, by avoiding rapid outgassing during copper formation.

TABLE 1

| Alcohol | Copper alkoxide | Ketone BPt | Alcohol BPt | TGA residue and cure temperature |
|---|---|---|---|---|
| 4-methyl-2-pentanol | Cu4MPA | 118° C. | 132° C. | Theoretical: 38.6% Found: 39.0 Cure = 118.0° C. |
| 2-hexanol | Cu2HXA | 127° C. | 136° C. | Found: 40.9% Theoretical: 38.6% Cure = 114.7° C. |

TABLE 1-continued

| Alcohol | Copper alkoxide | Ketone BPt | Alcohol BPt | TGA residue and cure temperature |
|---|---|---|---|---|
| 3-methyl-2-pentanol | Cu3PA | 118° C. | 131-134° C. | Found: 40.2% Theoretical: 38.3% Cure = 119° C. |
| 4,4-dimethyl-2-pentanol | CuDMP | 125-130° C. | ~140° C. | Found: 36.5% Theoretical: 35% Cure = 127° C. |
| 5-methyl-2-hexanol | CuMH | 145° C. | 148-150° C. | Found: 37.7% Theoretical: 35.3% Cure = 133° C. |
| 2-pentanol | Cu2PA | 101° C. | 118-119° C. | Found: 43.6% Theoretical: 42.7% Cure = 117.5° C. |
| 2-nonanol | Cu2NONA | 200° C. | 193-194° C. | Found: 20.2% Theoretical: 30.7% Cure = 120° C. |
| 2-octanol | Cu2OCTA | 173° C. | 174-181° C. | Found: 23.2% Theoretical: 33.0% Cure = 116.8° C. |

Table 2 listed all of the copper alkoxides synthesized by alcohol with G2 reactions. In all cases, 4 equivalents of dried and deoxygenated alcohol were reacted with 1 equivalent of G2 under an atmosphere of nitrogen at the temperature shown in Table 2. The alkyl substituted secondary alcohols cured within the range of 115-127° C. to give residual weights from within 0.07 to 2.4% of the theoretical copper residues. An exception was isopropanol, a symmetric secondary alcohol, which yielded an insoluble copper alkoxide, which in turn gave a very high residual weight vs. theoretical.

TABLE 2

| Alcohol [P] = primary [S] = secondary | Copper alkoxide | Product of reaction with G2 | Temperature C./ days of reaction | TGA residue and cure temperature |
|---|---|---|---|---|
| 4-methyl-2-pentanol [S] | Cu 4 MPA | Golden oil | 45° C./6 days | Theoretical: 38.6% Found: 39.0 Cure = 118.0° C. |
| 2-hexanol [S] | Cu 2 HXA | Golden oil | 45° C./6 days | Found: 40.9% Theoretical: 38.6% Cure = 114.7° C. |
| 3-methyl-2-pentanol [S] | Cu3PA | Golden oil | 45° C./6 days | Found: 40.2% Theoretical: 38.3% Cure = 119° C. |
| 4,4-dimethyl-2-pentanol [S] | CuDMP | Golden oil | 45° C./6 days | Found: 36.5% Theoretical: 35% Cure = 127° C. |
| 5-methyl-2-hexanol [S] | CuMH | Golden oil | 45° C./6 days | Found: 37.7% Theoretical: 35.3% Cure = 113° C. |
| 2-pentanol [S] | Cu2PA | Golden oil | 45° C./6 days | Found: 43.6% Theoretical: 42.7% Cure = 117.5° C. |
| 2-nonanol [S] | Cu2NONA | Waxy solid | 45 C./6 days | Found: 20.2% Theoretical: 30.7% Cure = 120° C. |
| 2-octanol [S] | Cu2OCTA | Waxy solid | 45 C./6 days | Found: 32.93% Theoretical: 33.0% Cure = 120° C. |
| 2-methylbutanol [P] | Cu MBA | Golden oil | 25° C./5 days | Theoretical: 42.2% Found: 42.2% Cure = 105° C. |
| 2-methyl-1-propanol [P] | Cu2MPA | solid | 25 C./5 dys | Theoretical: 46.5% Found: 35.15% Cure = 128.1° C. |
| Isopropanol (IPA) [S] | CuIPA | solid | 45° C./6 days | Theoretical: 40.1% Found: 61.4% Cure = 144.9° C. |
| Dimethylamino-2-propanol [S] | CuDMA2PA | oil | 25° C./5 days | Theoretical: 38.4% Found: 47.1% Cure = 145.1° C. |
| Methanol [P] | CuMA | decomposed | 25° C./1 day | |
| Ethanol [P] | CuET | decomposed | 25 C./1 hour | |
| Butanol [P] | CuBA | decomposed | 25 C./1 day | |

TABLE 2-continued

| Alcohol [P] = primary [S] = secondary | Copper alkoxide | Product of reaction with G2 | Temperature C./ days of reaction | TGA residue and cure temperature |
|---|---|---|---|---|
| 3-penten-2-ol [S] | Cu3PE2A | decomposed | 25° C./4 days | |
| 3-buten-2-ol [S] | Cu3BE2A | decomposed | 25° C./4 days | |

The other substituted unsaturated secondary alcohols, 3-penten-2-ol and 3-buten-2-ol, gave complete decomposition, and dimethylamino-2-propanol gave an excessively high residual weight.

The primary alcohols methanol, ethanol and butanol gave decomposed alkoxides, but the primary alcohols, 2-methylbutanol and 2-methypropanol gave alkoxides that were stable at room temperature and metallized to give copper at 105° C. and 128° C. respectively, thereby indicating that the copper alkoxides of the type $CuOCH_2CH(Me)R'$ are useful copper inks, even though they are derived from primary alcohols. Where R' is selected from the group consisting of an alkyl having 1 to 8 carbons, an alkenyl having 2 to 8 carbons, an alkynyl having 2 to 8 carbons, and combinations thereof;

The high performance of Cu4MPA and other secondary $C_4$-$C_{12}$ alcohol based copper alkoxides as a low temperature copper inks and the process of preparing a selection of copper alkoxide (CuOR) compounds by reacting an alcohol with the G2 complex, as described above, has been discovered. In the cases of methanol, ethanol, butanol, 3-penten-2-ol and 3-buten-2ol, the reaction with G2 resulted in complete decomposition to copper metal. In the case of isopropanol a solid product formed, which was found to be of marginal solubility in common solvents, and whose TGA/DSC showed a residue of 23% higher than theoretical for pure copper. Similarly, the TGA/DSC performance for DMA2PA also showed a residue, that was 23% higher than theoretical for pure copper.

Thus, among all copper alkoxide species in Table 2, Cu4MPA, Cu2HXA, Cu3PA, CuDMP, Cu5MH, Cu2NONA, Cu2OCTA, Cu2PA, Cu2MPA and Cu2MBA were found to cleanly yield liquid or waxy solid copper alkoxide species, which were both readily soluble in common solvents, such as hexane, toluene and glyme solvents, and found to show optimal performance in the TGA/DSC experiment, therefore show their high suitability as copper inks.

These copper inks are highly soluble in or miscible with solvents, such as toluene, xylene, polyalkylaromatics, alkoxy aromatics, tertiary amines, hexane, secondary amines, primary amines, diamines, triamines, nitriles, silylnitriles, isocyanates, ethers, ketones, amides, esters, carbamates, carbonates, diketones, aldehydes, silanes, pyridines, pyrrolidines, imidazoles, pyrimidines, analines, alkanes, haloalkynes, siloxanes, alkenes, dienes, trienes or glymes. Alcohols, diols, and triols can also be used, but this can results in other alkoxide species forming in the resulting solution due to alkoxy group exchange occurring. In addition, it was found that a relatively small quantity of added solvent dramatically lowers the viscosity of the inks, so that they can be processed in an ink jet printer. For instance, adding just 0.8 grams of dry deoxygenated toluene to 3.0 g of Cu4-MPA oil gave a low viscosity ink >6.0M in copper (that is >38 wt % copper metal), which we successfully printed by ink jet in a nitrogen atmosphere. In addition, we have shown by TGA that the metallization temperature for these inks does not decrease, when diluted with solvent. Rather, the influence of the solvent is to slightly increase the metallization temperature.

We have found that not all copper alkoxides are suitable as copper inks, since they are either unstable at room temperature and decompose to copper metal during their synthesis, or they are non-melting, poorly soluble solids, that do not cleanly decompose to give volatile by-products and a residue of essentially pure copper. We also found that the poorly performing copper alkoxide inks displayed erratic TGA traces, indicative of relatively uncontrolled thermochemical changes, leading to impure involatile residues, rather than a pure copper film.

Copper alkoxides that were based upon secondary alcohols in the molecular weight range of between $C_4$ and $C_{12}$, preferably asymmetric, were found to perform well as copper inks. This combination of characteristics provided for liquid and/or highly soluble copper alkoxides, that cleanly decompose by thermal anneal to give conducting copper films.

Symmetric secondary alcohol, isopropanol gave an insoluble solid with a high residual vs theoretical weight.

Lower molecular weight alcohols, such as isoproxide or primary alcohols, leaded to insoluble symmetrical alkoxides, which are either unstable and/or produce poorly performing impure copper films.

Copper alkoxides of excessively high molecular weights leaded to a number of undesirable characteristics, such as higher dilution of copper content (that is a higher ratio of organic to copper metal) and more involatile organic by-products being produced in the metallization step, which may become trapped in the copper film. Additionally, higher molecular weights of >$C_{12}$ also offered the potential for a higher degree of hydrocarbon backbone fracturing during metallization, which also adds to organic contamination of the final copper film.

Copper alkoxides based upon primary alcohols in the $C_4$-$C_{12}$ range, or any other range, are susceptible to thermal instability, and therefore, suffered from uncontrolled thermal decomposition (see Table 2 above), and therefore, shelf life problems. An exception was where the primary alkoxide contains the $CuOCH_2CH(Me)R'$ group. Where R' is selected from the group consisting of an alkyl having 1 to 8 carbons, an alkenyl having 2 to 8 carbons, an alkynyl having 2 to 8 carbons, and combinations thereof.

On the other hand, copper alkoxides based upon tertiary alcohols in the $C_4$-$C_{12}$ range, or any other range, were found to be thermally inert. This was due to their lack of a hydrogen atom on the carbon bonded to oxygen thereby, slowing redox reduction of Cu/oxidation to ketone.

Thus, in another exemplary embodiment, copper tertiary alkoxides are used as source materials from which to synthesize the copper inks of the present invention.

In this alternative synthesis process, the copper tertiary alkoxide is prepared and synthesized according to known procedures, and then, mixed with a suitable alcohol, such as 2-nonanol. In this example, the tertiary alkoxide then deprotonated the 2-nonanol to give Cu2-nonaoxide and free tertiary alcohol. If necessary, the boiling point of the parent tertiary alcohol of the copper tertiary alkoxide was chosen, such that it was significantly lower than the boiling point of the added 2-nonanol. Thus, the reaction mixture could be set in a temperature range sufficiently low as to prevent copper metallization from occurring, but high enough that the free tertiary alcohol could be boiled off, while leaving the added 2-nonanol in the reaction mixture to continue reacting with the copper tertiary alkoxide. In this way, we demonstrated that the known molecule copper t-butoxide can be prepared and then individually mixed in 5% excess with either deoxygenated dry 2-nonanol or 2-octanol in tetrahydrofuran solvent under nitrogen at room temperature for 2 hours at which point the solvent and excess alcohol can be removed by vacuum to yield Cu2NONA and Cu2OCTA respectively. By TGA, these two compounds were shown by TGA to give the same thermochemical signature as the same inks made by the G2 route described above.

To ensure complete reaction, a greater excess 2-nonanol might be added and once the reaction was complete, it could be distilled off at reduced pressure and temperature.

In yet another exemplary embodiment, the copper alkoxide based inks of the present invention can be synthesized by first reacting G2OR with n-butyl lithium or other metallizing agent, such as sodium metal, sodium or calcium hydride, potassium metal or potassium hydride, then reacting the resultant anion with copper halide to yield CuOR, which can then be separated from the lithium or other metal halide by-product, and then, purified by sublimation, vacuum distillation, recrystalization or other suitable technique. It is then reacted with HOR to give the desired copper alkoxide, CuOR, and regenerated G2OR, which in turn can then be recycled through the same reaction to give CuOR again. It is noted that the substituent group present in the G2OR molecule may be varied to maximize the physical properties of the CuG2OR complex to aid in its optimal purification. For instance, phenyl groups could be added to render the CuG2OR complex easily recrystalizable, or fluorinated groups might be added to render the complex more volatile for purification by sublimation or distillation.

Alternatively, other organometallic copper+1 compounds, such as copper mesitylene, can be reacted with alcohols to give copper alkoxide inks.

In yet another exemplary embodiment, the copper alkoxide inks of the present invention can be prepared by treating an alcohol ROH with deprotonating metal agent, such as metal hydride, reactive metal or alkyl lithium species, then reacting the resulting metal alkoxide with a copper source, such as copper halide, oxide, carbonate, sulfate, acetate, trifluoroacetate, trifluoromethylsulfonate, phenoxide, carbide, or amide.

In yet another exemplary embodiment, the copper alkoxide inks of the present invention can be prepared by the following method.

A copper amide species, such as copper dialkylamide, can be synthesized by lithiating a secondary amine, then reacting it with a copper halide, then purifying it to remove contaminants, such as, but not limited to, halides. This purified copper dialkylamide is then reacted with a suitable alcohol ROH to give the copper alkoxide CuOR, and in the process, regenerate the starting secondary amine by protonation from the alcohol. If desired, this secondary amine can then be recycled for additional reactions to make further copper alkoxide CuOR. Alternatively, a metal can be reacted with a suitable alcohol, as above, to give a metal alkoxide, which is then dissolved in a suitable medium, such as tBuCN, to give an electrically conducting medium. Then, by applying an electric current of a suitable potential to this mixture using copper electrodes, copper alkoxide is electrochemically prepared and then separated from this mixture.

Additional benefits of the inks of the present invention include their ability to be blended together, yet still retain their individual metallization isotherms as their admixture is thermally cured.

In yet another exemplary embodiment, especially desirable copper inks can be created by mixing together two or more copper alkoxides, which are know to independently metallize to give copper films at slightly different temperatures. As such, a mixture of copper alkoxides is gradually heated, the first alkoxide metallizes at temperature T1, which provides copper nuclei to serve as 'seed' copper particles, upon which the second copper alkoxide can metallize at the higher temperature T2, thereby creating a copper film comprised of larger copper particles fused together into a conducting matrix of overall higher density, than when an ink comprised of only one copper alkoxide is thermally cured.

Figure 6:
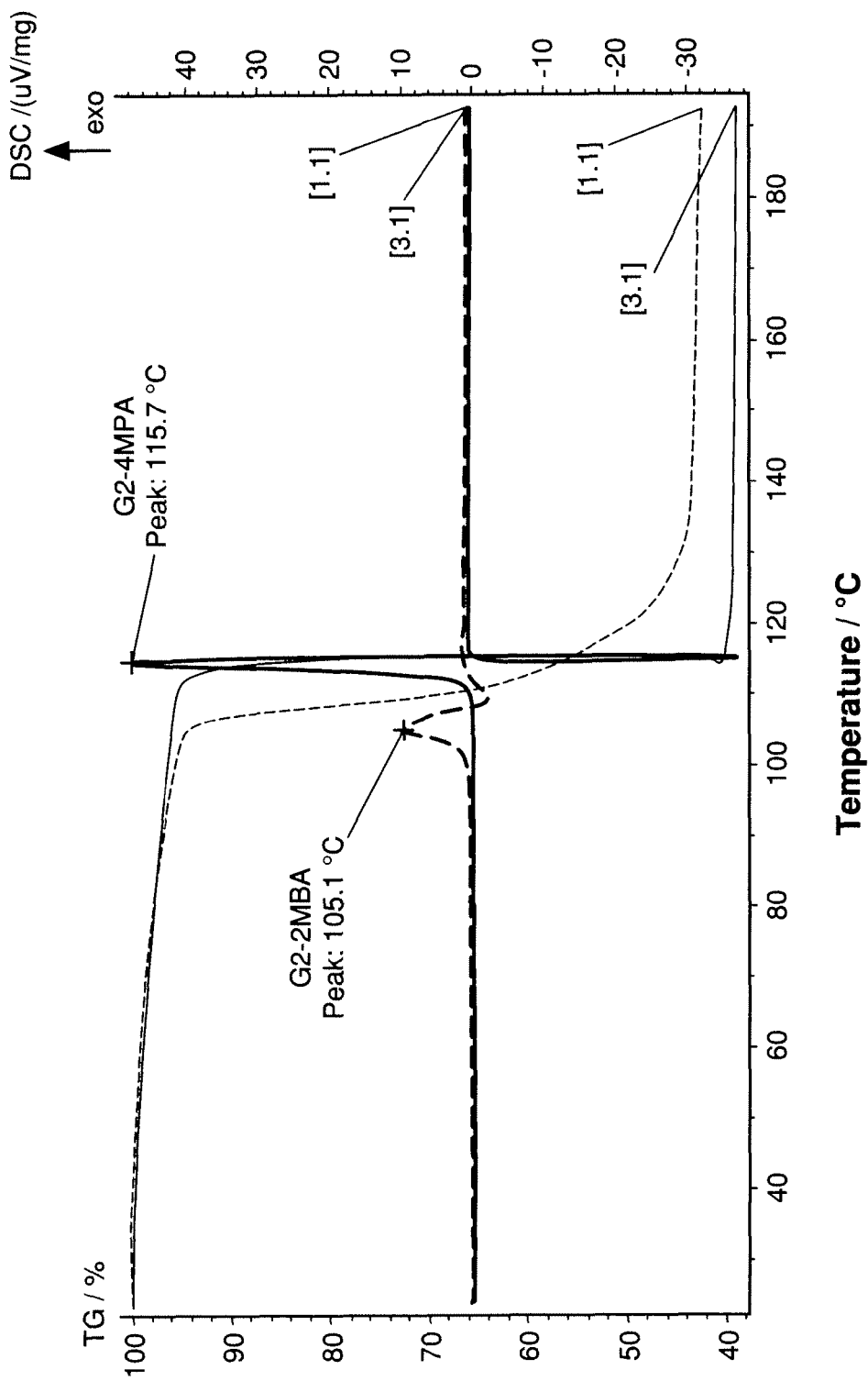
FIG. 6 is a TGA/DSC of the decomposition of copper-4-methyl-2-pentanoxide(Cu4MPA).

This is illustrated below in FIG. 6 for a mixture of copper-2-methylbutanol ("Cu2MBA") and copper-4-methylbutanol ("Cu4MBA"), where the former is seen to cure at its relatively low temperature, and the latter at its relatively high temperature. Thus, as the curing temperature is steadily raised, the ink curing at the lower temperature forms a copper metal matrix, which can then become filled by the copper released from the higher temperature copper ink as it cures. By carefully selecting the exact ratio of different copper alkoxide species of ascending cure temperatures in an ink mixture, a dense copper film can be achieved.

In yet another exemplary embodiment, the copper alkoxide inks of the present invention can be prepared by using an alcohol which is comprised of a mixture of two or more optical isomers. A copper alkoxide formed by using this type of the alcohol will also be a similar isomeric mixture. Thus, when a copper film is formed by the thermal curing of such an ink, then the resulting copper film is anticipated to show no preferred orientation. However, if one discrete isomer is selected from the mixture of isomers and then a copper alkoxide is prepared from it as described above, then the resulting copper alkoxide will be isomerically pure. If a copper film is then in turn prepared from this isomerically pure copper alkoxide, it is to be expected that it will posses a metallurgically preferred orientation. Alternatively, the size of the copper particles formed from it is expected to have a more uniform size distribution.

Alternatively, mixtures of alcohols can be reacted in the schemes above to yield mixed copper alkoxides.

Suitable alcohols from which to make copper alkoxide inks, include but are not limited to, secondary alcohols of butanol, pentanol, hexanol, heptanol, octanol and nonanol and isomers thereof. Especially useful are alcohols of $C_8$ and $>C_8$ secondary alcohols, which allow metallization to occur before the boil-off of metallization by-products. Also, diols, triols and ether substituted alcohols can be used.

A superior thermal cure of the above described inks can be achieved by performing the cure in a reducing gas environment, such as 4% hydrogen in nitrogen. This ensures that any copper oxide species, that may be formed during the cure process, will be reduced back to copper metal. Since the copper formed during the cure process tend to be nanoparticulate, its high surface curvature is expected to yield copper oxides of exceptional reactivity towards being reduced to copper metal by hydrogen. Similarly, the final copper film can also be subjected to an anneal in an electron attachment activated hydrogen environment (e.g. 4% $H_2$ in $N_2$) to reduce any copper oxides back to copper metal, to provide a more conductive copper film.

It is well known that copper metal particles, which have been exposed to air, acquire a non-electrically conducting coating of 'native' copper oxides. If a copper ink is largely comprised of copper particles, this copper oxide presents an impediment towards the sintering of the copper powders into a conducting matrix. Therefore, it first must be removed, if sintering is to be achieved. Thus, when preparing copper inks, which contain substantial amounts of copper powder, it is advantageous to use copper powders, which are oxide free. Further, it is advantageous to create an ink based upon copper oxide-free copper powders mixed with a copper alkoxide, which can grow fresh copper metal in a thermal cure to fuse the copper particles together into a conducting matrix. Creating such a copper ink presents a challenge, since copper powders, once synthesized, are typically coated with copper oxides, However, such an ink is readily and conveniently prepared from the copper alkoxide compounds described in the present invention in the following way.

Thus, another embodiment contains the following steps. First, under an inert atmosphere, such as nitrogen, the copper alkoxide compound is diluted in a suitable non-interacting aprotic solvent of suitable boiling point, such as toluene, to facilitate easy mixing and stirring. This mixture is then slowly heated to a suitable temperature to partially cure the copper alkoxide to a degree, such that a substantial percentage of it is converted to copper metal particles. The solvent and by-products from the metallization reaction are then removed by the application of vacuum distillation, resulting in a mixture comprised of copper alkoxide and copper powders, whose surfaces are oxide free. Thus, the surfaces of the copper powders are in intimate contact with the copper alkoxide. When this homogeneous mixture is then heated to its full cure temperature, the copper alkoxide decomposes to yield fresh copper metal, which then fuses the copper particles together into a conducting matrix. In this way, an ink of very high copper content can be created, which yields a very dense copper film. Alternatively, copper powders are created, whose surfaces are coated with a non-oxide species, which is non-reactive with copper alkoxide, but which can desorb from the powder surface during thermal cure, thereby permitting the fresh copper to fuse the copper particles together.

WORKING EXAMPLES

Example 1

Synthesis of Cu4MPA

One equivalent of G2 complex was mixed with 4.4 equivalent of dry deoxygenated 4-methyl-2-pentanol and stirred for 6 days at 45° C. under a nitrogen atmosphere. During this period, the mixture became a clear yellow liquid with a trace of copper particulates. These were filtered off using a 0.1 micron filter. The resulting solution was connected to a distillation system, then heated to 40° C. under dynamic vacuum with the receiving vessel cooled with liquid nitrogen. 12 hrs later, all of the G2OR by-product had transferred into the receiving vessel leaving the Cu4MPA as a clear golden yellow oil.

The above process was applied to the appropriate alcohols listed in Table 2 to yield the copper inks Cu4MPA, Cu2HXA, Cu3PA, CuDMP, Cu5MH, Cu2NONA, Cu2OCTA, Cu2PA, Cu2MPA and Cu2MBA.

Example 2

Synthesis of Cu2OCTA 1.0 g of copper t-butoxide was dissolved in 20 ml of dry deoxygenated tetrahydrofuran under nitrogen at room temperature. To this was added 1.05 g of dry 2-octanol and the mixture stirred for 2 hours. The volatiles were then removed to yield 1.23 g CuOCTA (91.1%)

Example 3

Synthesis of Cu2NONA 1.0 g of copper t-butoxide was dissolved in 20 ml of dry deoxygenated tetrahydrofuran under nitrogen at room temperature. To this was added 1.11 g of dry 2-nonanol and the mixture stirred for 2 hours. The volatiles were then removed to yield 1.20 g CuNONA (82.7%)

Example 4

Ink Jet Ink

Figure 7:
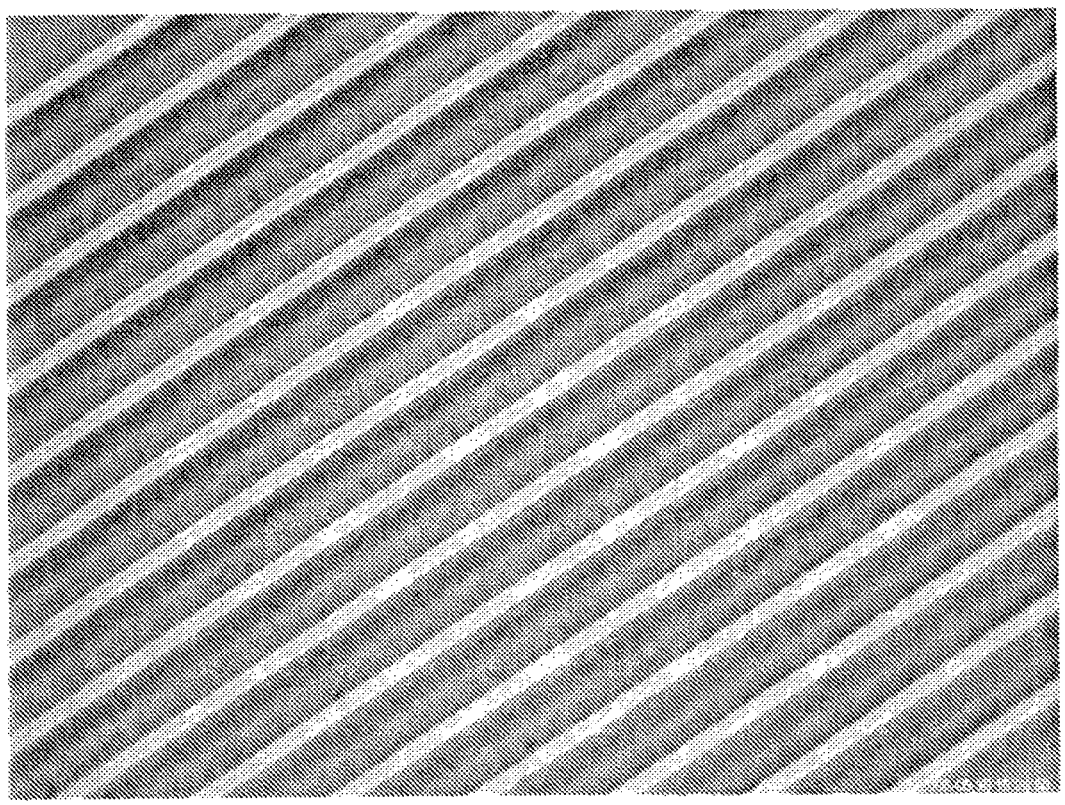
FIG. 7 is an optical micrograph of copper lines printed on flexible polyester using the copper ink copper-4-methyl-2-pentanoxide(Cu4MPA) and then thermally cured.
Figure 8:
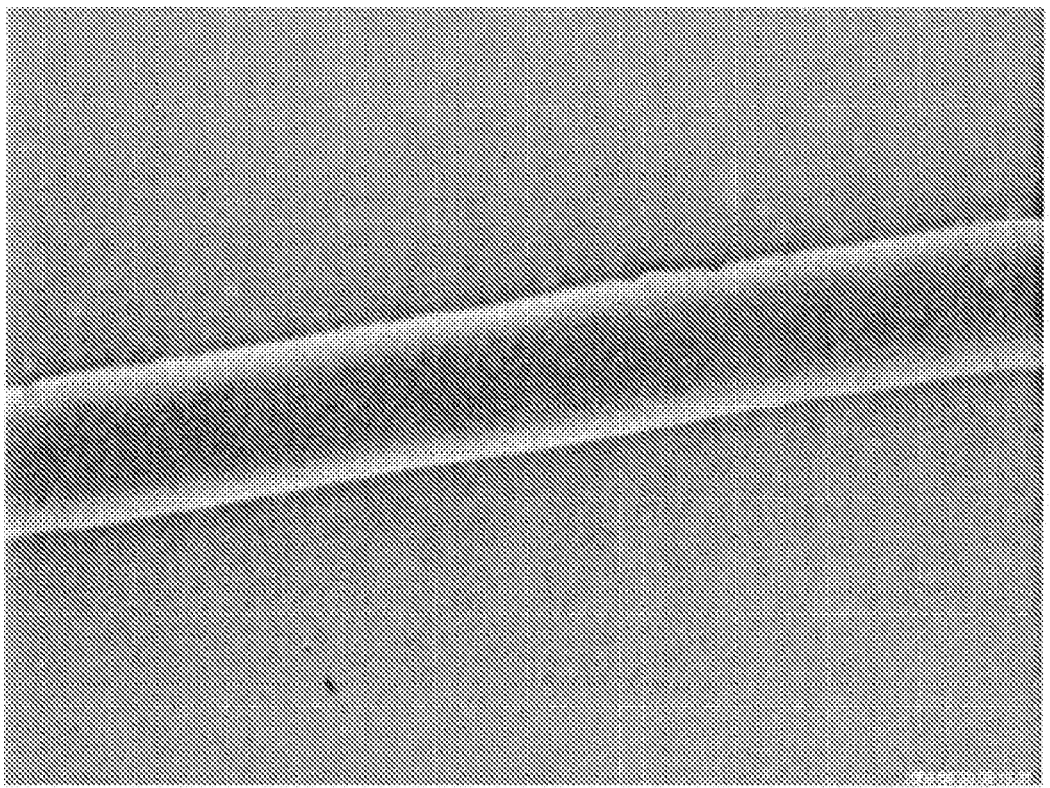
FIG. 8 is a magnification of the image of FIG. 7.

A 3.0 g sample of Cu4MPA from the above Example 1 was mixed with 0.8 g of dry deoxygenated toluene and the resulting highly fluid yellow solution was printed as an ink using a Microfab ink jet printer housed in an inert atmosphere (nitrogen) Braun glove box. The printhead was piezoelectrically driven to produce approximately 80 um droplets from a 60 um orifice using a bipolar waveform of 1/35/1/35/1 μsecs at an amplitude or ±30 volts. Droplet velocity was 1.25M/sec. Glass slides and flexible polyester substrates were used and gave spot sizes of approximately 325 um. By printing in a continuous mode, while moving the substrate beneath the printhead, straight lines of printed ink were achieved. Conversion to copper metal was observed as a change from a transparent film to a dark film of copper upon transferring the substrate to a hot plate at 180° C., the actual temperature of conversion being that which was observed in the TGA experiments, that is; 115° C. Images of the copper lines printed onto flexible polyester and glass slides and then thermally cured were shown in FIGS. 7 and 8, respectively.

Figure 9:
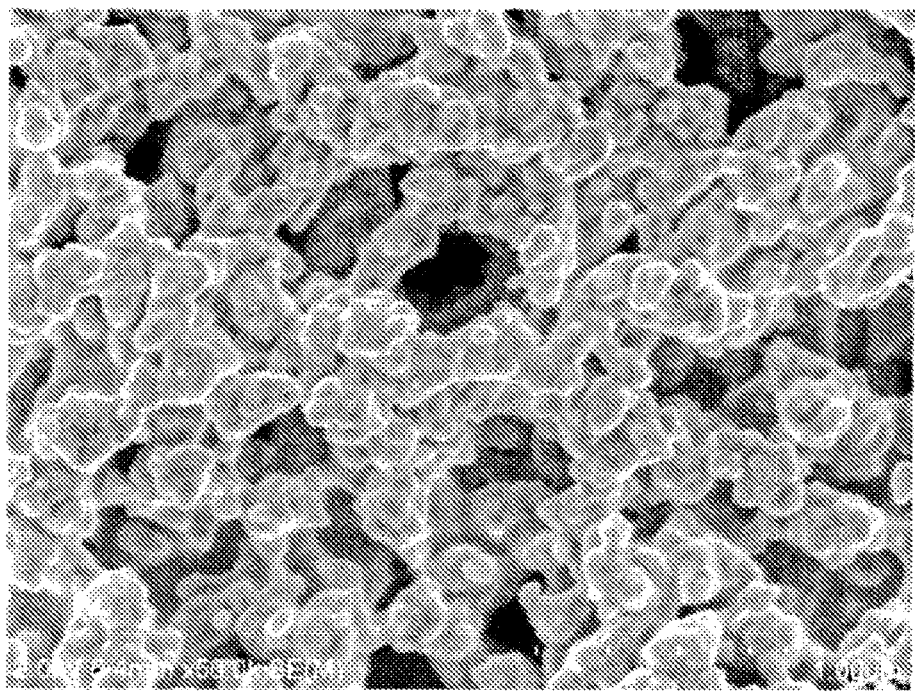
FIG. 9 is a 50,000× magnification Scanning Electron Microscope (SEM) of the sintered copper lines shown in FIGS. 7 and 8
Figure 10:
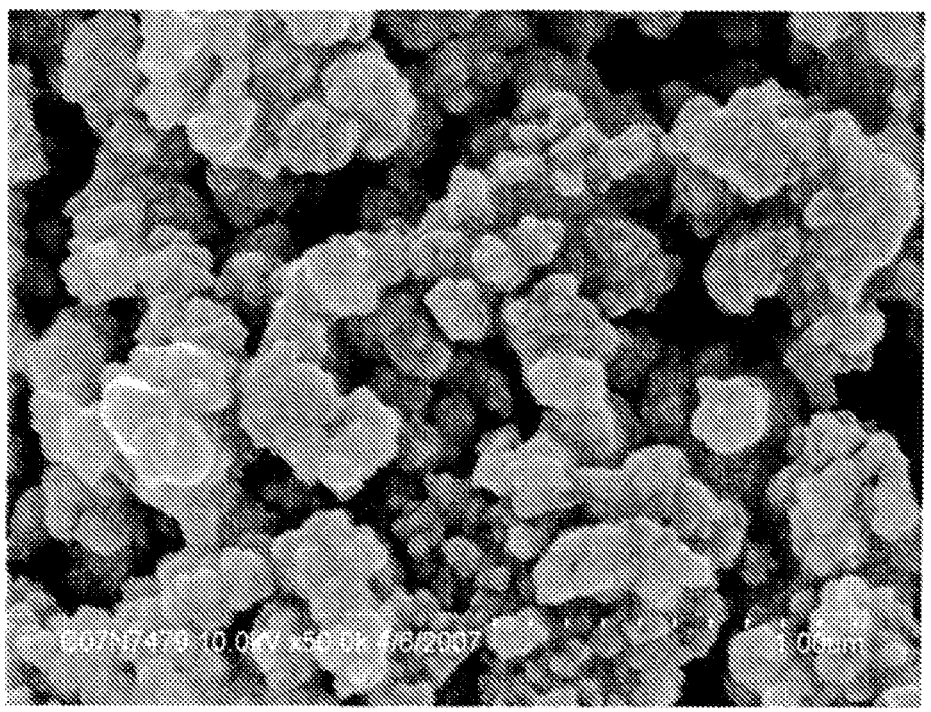
FIG. 10 is a Scanning Electron Microscope (SEM) of thermally cured copper from the copper ink copper-2-hexanoxide (Cu2HXA).
Figure 11:
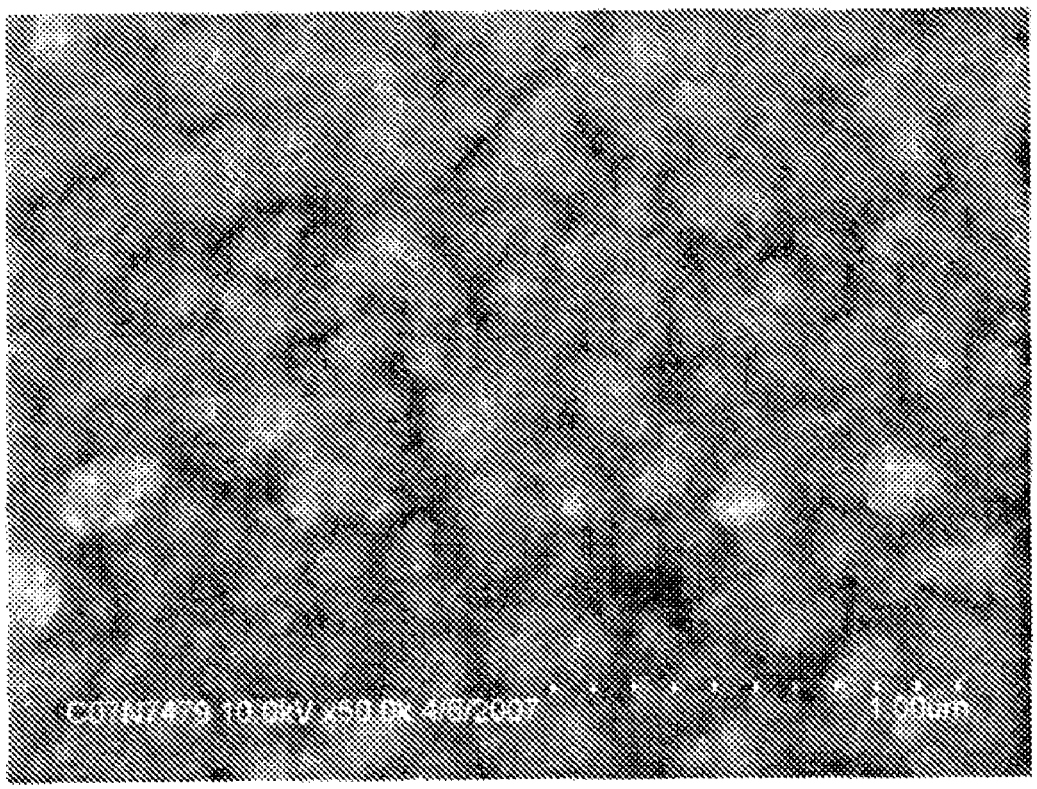
FIG. 11 is a Scanning Electron Microscope (SEM) of thermally cured copper from the copper ink Cu-2-nonanoxide (Cu2NONA).

A high magnification picture of the copper as printed and annealed was shown in FIG. 9, indicating it to be comprised of sintered copper nanoparticles. It was noteworthy that the porous copper of FIG. 9 is very similar to that of the copper obtained by curing Cu2HXA (FIG. 10), consistent with the boiling points of its metallization by-products at 127 and 136° C. being close to its metallization temperature of 114.7° C. (see Table 1). However, by comparison Cu2NONA, shown in FIG. 11, was obviously much flatter and apparently not as porous, consistent with its high boiling point by-products (200 and 193-194° C., Table 1), 75° C. higher than it metallization temperature at 120° C. Adhesion to the polyester substrates was found to be excellent, with no copper being removed from the substrate after the forceful application of Scotch tape followed by its rapid removal, that is, it passed the 'Scotch tape test'.

Figure 12:
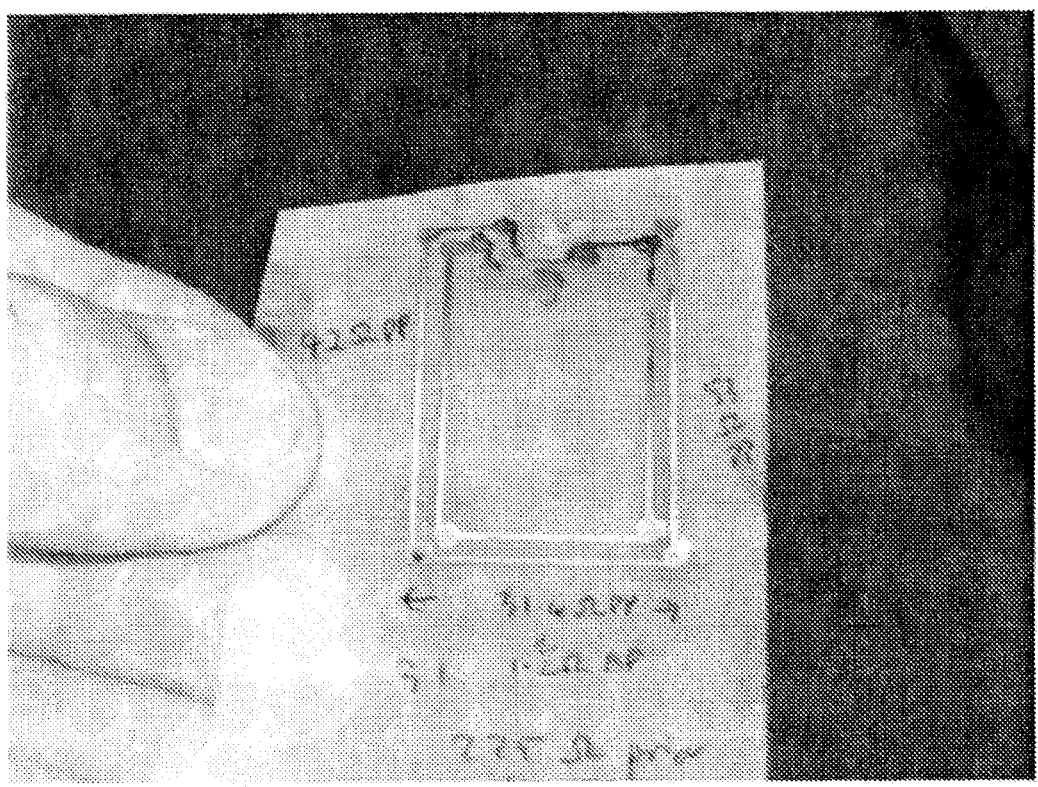
FIG. 12 is a model of a patterned Radio Frequency Identification circuit ("RFID") using printed copper supplemented with further copper deposited by electroplating.

In separate experiments, conducting lines were printed in an pattern to mimic that of an RFID antenna and then immersed as the cathode in a simple copper electroplating bath comprising a dilute copper sulfate solution to which a small amount of sulfuric acid had been added to aid in conductivity and a piece of copper metal to act as the anode with a potential of ~6V applied across the electrodes from a battery. This resulted in the transfer of copper metal from the anode to the printed copper pattern, giving in a thicker copper pattern of lower overall resistance, as shown in FIG. 12. The resistivity of a printed line dropped from 31.4 to 1.2 ohms. Thus, the use of the copper inks described in the present invention for printing a copper seed layer for a bulk electroplated copper film for RFID antennas or other applications dependent upon electroplated copper was demonstrated.

Figure 13:
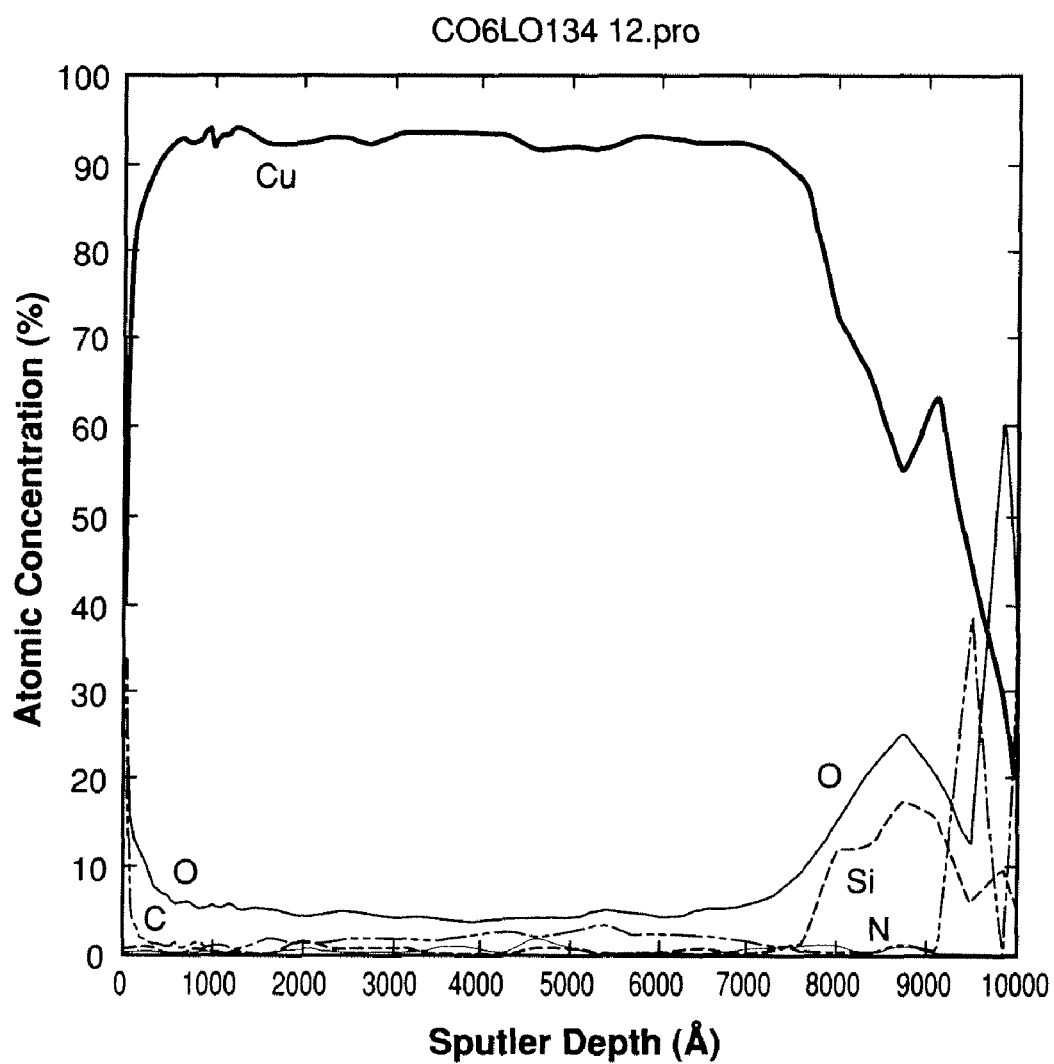
FIG. 13 is an Auger spectrum of copper deposited by the process of the present invention.

The Auger spectrum of a typical copper film using the above processing conditions was shown in FIG. 13, indicating it was copper metal with a small percentage of oxygen, probably due to surface copper oxidation.

Figure 14:
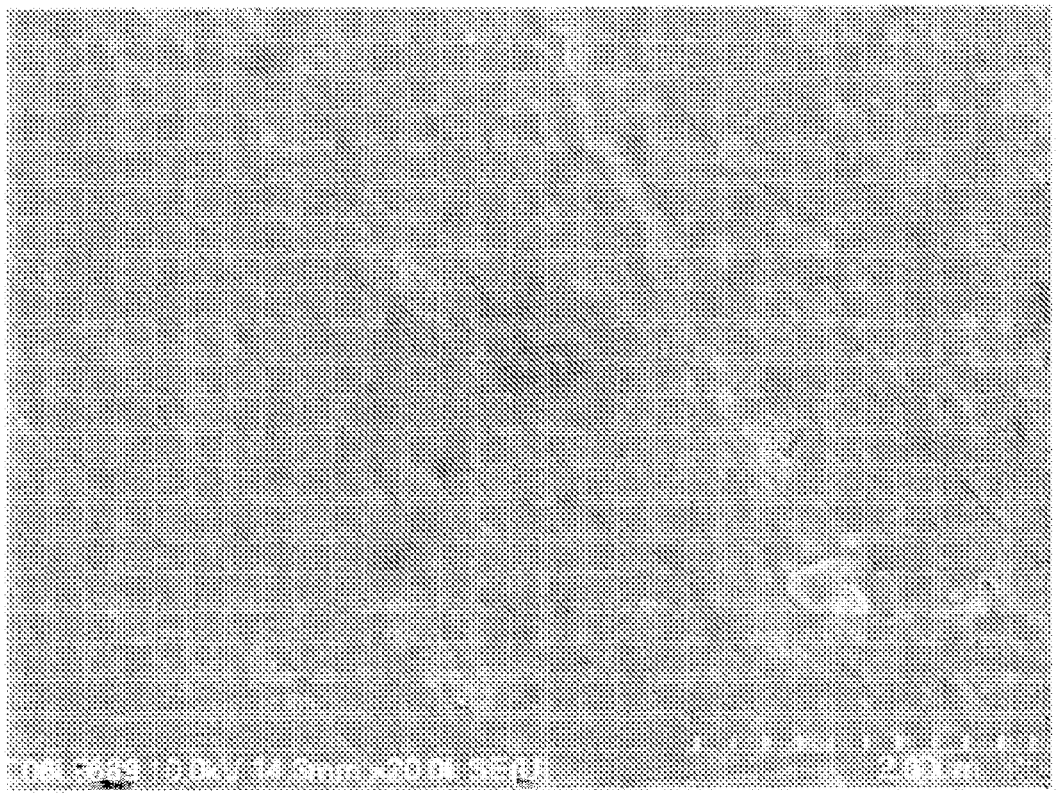
FIG. 14 is a Scanning Electron Microscope (SEM) of a densified copper deposition achieved by controlled temperature ramping rate in the annealing of a copper printing using copper-4-methyl-2-pentanoxide (Cu4MPA).

It was found that the density of the copper film prepared by ink jet/thermal anneal could be improved by controlling the temperature ramp rate. As shown in FIG. 14, the upper portion of a Cu4MPA sample cured at the temperature ramp rate of 2° K./min showed a densified region of copper, when compared to that observed in FIG. 9, wherein the Cu4MPA sample cured at temperature ramp rate of 25° K./min. Thus, it is demonstrated that careful control of temp ramp rates can yield copper films of improved density. The lower temperature ramp rate gives more densified copper metal form.

The present invention has been set forth with regard to several embodiments and alternatives, but the full scope of the present invention should be ascertained from the claims which follow.

The invention claimed is:

1. A precursor containing two or more copper alkoxides having different metallization temperatures, and each alkoxide having a formula Cu—O—R;
    wherein —O—R is selected from the group consisting of a radical of a secondary alcohol having an alkyl group of $C_4$ to $C_{12}$; a primary alcohol giving $CuOCH_2CH(Me)R'$; and mixtures thereof;
    wherein R' is selected from the group consisting of an alkyl having 1 to 8 carbons, an alkenyl having 2 to 8 carbons, an alkynyl having 2 to 8 carbons, and combinations thereof.

2. The precursor of claim 1 wherein the secondary alcohol is an asymmetric, saturated, alkyl group of $C_4$ to $C_{12}$.

3. The precursor of claim 1 wherein the secondary alcohol is selected from the group consisting of butanol, pentanol, hexanol, heptanol, octanol, nonanol, and mixtures thereof.

4. The precursor of claim 1 wherein the primary alcohol is selected from the group consisting of 2-methylbutanol, 2-methyl-1-propanol, and mixtures thereof.

5. The precursor of claim 1 is selected from the group consisting of copper-2-pentanoxide, copper-2-hexanoxide, copper-2-octanoxide, Cu-2-nonanoxide, copper-3-methyl-2-pentanoxide, copper-4-dimethyl-2-pentanoxide, copper-4-methyl-2-pentanoxide, copper-5-methyl-2-hexanoxide, copper-methyl-1-butanol, copper-2-methyl-1-pentanoxide and mixtures thereof.

6. The precursor of claim 1 has a metallization temperature less than 150° C.

7. The precursor of claim 1 containing a solvent selected from the group consisting of toluene, xylene, polyalkylaromatics, alkoxy aromatics, tertiary amines, hexane, secondary amines, primary amines, diamines, triamines, nitriles, silylnitriles, isocyanates, ethers, ketones, alcohols, diols, triols, phenols, amides, esters, carbamates, carbonates, diketones aldehydes, silanes, pyridines, pyrrolidines, imidazoles, pyrimidines, analines, alkanes, haloalkynes, siloxanes alkenes, dienes, trienes, glymes and mixtures thereof.

8. The precursor of claim 7 wherein the solvent has a boiling temperature higher than metallization temperature of the precursor.

9. A process for synthesizing a precursor containing at least one copper alkoxide comprising reacting an alcohol with a copper compound selected from a group consisting of a bi-nuclear copper organometallic compound; copper mesitylene; copper tertiary alkoxide made from tertiary alcohol; and mixtures thereof.

10. The process of claim 9 wherein the bi-nuclear copper organometallic compound is [—$CuNMe_2SiMe_2CHSiMe_3CuNMe_2SiMe_2CHSiMe_3$—].

11. The process of claim 9 wherein the tertiary alcohol is an alkyl group of $C_4$ to $C_{12}$.

12. The process of claim 9 wherein the alcohol is an asymmetric, saturated, alkyl group of $C_4$ to $C_{12}$.

13. The process of claim 9 wherein the alcohol is a secondary alcohol selected from the group consisting of butanol, pentanol, hexanol, heptanol, octanol, nonanol, and mixtures thereof.

14. The process of claim 9 wherein the alcohol is a primary alcohol selected from the group consisting of 2-methylbutanol, 2-methyl-1-propanol, and mixtures thereof.

15. The process of claim 9 wherein the precursor has a metallization temperature less than 150° C.

16. The process of claim 9 wherein the precursor contains two or more of the at least one copper alkoxide having different metallization temperatures.

17. The process of claim 9 wherein the precursor of claim 1 is selected from the group consisting of copper-2-pentanoxide, copper-2-hexanoxide, copper-2-octanoxide, Cu-2-nonanoxide, copper-3-methyl-2-pentanoxide, copper-4-dimethyl-2-pentanoxide, copper-4-methyl-2-pentanoxide, copper-5-methyl-2-hexanoxide, copper-methyl-1-butanol, copper-2-methyl-1-pentanoxide and mixtures thereof.

18. The process of claim 9 wherein the precursor further contains a solvent selected from the group consisting of toluene, xylene, polyalkylaromatics, alkoxy aromatics, tertiary amines, hexane, secondary amines, primary amines, diamines, triamines, nitriles, silylnitriles, isocyanates, ethers, ketones, alcohols, diols, triols, phenols, amides, esters, carbamates, carbonates, diketones aldehydes, silanes, pyridines, pyrrolidines, imidazoles, pyrimidines, analines, alkanes, haloalkynes, siloxanes alkenes, dienes, trienes, glymes and mixtures thereof.

19. A precursor containing at least one copper alkoxide selected from the group consisting of copper-2-hexanoxide, copper-2-octanoxide, Cu-2-nonanoxide, copper-3-methyl-2-pentanoxide, copper-4-dimethyl-2-pentanoxide, copper-4-methyl-2-pentanoxide, copper-5-methyl-2-hexanoxide, copper-methyl-1-butanol, copper-2-methyl-1-pentanoxide, a copper alkoxide having formula Cu—O—R, and mixtures thereof;
    wherein —O—R is a primary alcohol selected from the group consisting of 2-methylbutanol, 2-methyl-1-propanol, and mixtures thereof; and mixtures thereof.

20. The precursor of claim 19 has a metallization temperature less than 150° C.

21. Precursor of claim 19 containing a solvent selected from the group consisting of toluene, xylene, polyalkylaromatics, alkoxy aromatics, tertiary amines, hexane, secondary amines, primary amines, diamines, triamines, nitriles, silylnitriles, isocyanates, ethers, ketones, alcohols, diols, triols, phenols, amides, esters, carbamates, carbonates, diketones aldehydes, silanes, pyridines, pyrrolidines, imidazoles, pyrimidines, analines, alkanes, haloalkynes, siloxanes alkenes, dienes, trienes, glymes and mixtures thereof.

22. The precursor of claim 19 wherein the solvent has a boiling temperature higher than metallization temperature of the precursor.

23. The precursor of claim 19 contains two or more of the at least one copper alkoxide having different metallization temperatures.

* * * * *

UNITED STATES PATENT AND TRADEMARK OFFICE
CERTIFICATE OF CORRECTION

PATENT NO. : 8,143,431 B2  
APPLICATION NO. : 12/126333  
DATED : March 27, 2012  
INVENTOR(S) : John Anthony Thomas Norman, Melanie K. Perez and Robert Krantz Pinschmidt, Jr.

Page 1 of 1

It is certified that error appears in the above-identified patent and that said Letters Patent is hereby corrected as shown below:

In the Claims:

Column 18, Line 47

In Claim 19 delete "and mixtures thereof;"

Signed and Sealed this  
Twenty-third Day of April, 2013

Teresa Stanek Rea  
*Acting Director of the United States Patent and Trademark Office*